United States Patent [19]
Hopper

[11] Patent Number: 6,103,605
[45] Date of Patent: Aug. 15, 2000

[54] PROCESS FOR DEFINING THE WIDTH OF SILICON GATES USING SPACERS AS AN ETCH HARD MASK

[75] Inventor: Peter J. Hopper, San Jose, Calif.

[73] Assignee: National Semiconductor Corporation, Santa Clara, Calif.

[21] Appl. No.: 09/271,080

[22] Filed: Mar. 17, 1999

[51] Int. Cl.[7] .............................................. H01L 21/3205
[52] U.S. Cl. .......................................... 438/585; 438/947
[58] Field of Search ..................................... 438/694, 696, 438/700, 702, 703, 585, 595, 947

[56] References Cited

U.S. PATENT DOCUMENTS

| | | | |
|---|---|---|---|
| 4,313,782 | 2/1982 | Sokoloski | 156/628 |
| 4,489,481 | 12/1984 | Jones . | |
| 5,496,750 | 3/1996 | Moslehi | 437/41 |
| 5,514,609 | 5/1996 | Chen et al. | 437/45 |
| 5,770,506 | 6/1998 | Koh | 438/303 |
| 5,950,091 | 9/1999 | Fulford, Jr. et al. | 438/303 |

OTHER PUBLICATIONS

Wolf, S., et al.: *Silicon Processing For The VLSI Era*, vol. 1,*Process Technology*, pp. 185, 522, Lattice Press, (1986).

*Primary Examiner*—Richard Booth
*Attorney, Agent, or Firm*—Limbach & Limbach LLP

[57] ABSTRACT

Process for controllably defining the width of silicon gates to critical dimensions. The process includes steps of first providing a semiconductor substrate (e.g. a silicon wafer) with a gate oxide layer on its surface, followed by depositing a silicon (e.g. polysilicon or amorphous silicon) gate layer on the gate oxide layer. A first oxide layer (e.g. a PSG, TEOS-based or silane-based oxide layer) is then formed on the silicon gate layer. Next, the first oxide layer is patterned to form a patterned first oxide layer, exposing portions of the silicon gate layer. A second oxide layer is then formed on the patterned first oxide layer and the exposed portions of the silicon gate layer. A first silicon (e.g. polysilicon or amorphous silicon) layer is subsequently formed on the second oxide layer. The first silicon layer is then patterned to form a patterned first silicon layer with sidewalls, exposing portions of the second oxide layer. A conformal spacer precursor layer (e.g. of $Si_3N_4$ or PSG) is subsequently formed over the patterned first silicon layer and the exposed portions of the second oxide layer. The conformal spacer precursor layer is then etched to form spacers on the sidewalls. The patterned first silicon layer is then removed, followed by the removal of exposed portions of the second oxide layer. The silicon gate layer is subsequently etched, using at least one of the spacers as an etch hard mask, to define silicon gates of critical dimensions less than 0.10 micron.

11 Claims, 5 Drawing Sheets

PROCESS FOR DEFINING THE WIDTH OF SILICON GATES USING SPACERS AS AN ETCH HARD MASK

BACKGROUND OF THE INVENTION

1. Field of the Invention

The present invention relates to semiconductor device fabrication and, in particular, to processes for the fabrication of patterned silicon gate layers.

2. Description of the Related Art

The fabrication of semiconductor devices, such as transistors, often involves the processing of a semiconductor substrate (e.g. a silicon wafer) through a series of steps, including the implantation of dopant atoms into the substrate, the deposition/growth of electrically insulating and conducting layers on the substrate, and the formation of patterned layers on the substrate via lithography and etching techniques. A prevailing trend in semiconductor device fabrication technology is to reduce the size of the semiconductor devices in order to increase device performance and device packing density (i.e. the number of semiconductor devices per unit area of semiconductor substrate), as well as to decrease the power consumption of the semiconductor devices. For transistors that employ a polysilicon gate, the width of the polysilicon gate (i.e. the "physical gate length") is a primary factor in determining the size of the transistor. Upon patterning of polysilicon gate layers, it is, therefore, desirable to define the resulting polysilicon gate width to minimum dimensions for a given process technology. As these minimum dimensions (i.e. "critical" dimensions) are reduced below 0.25 microns to 0.10 microns and less, however, it becomes increasingly difficult to controllably define the polysilicon gate width using conventional lithographic techniques.

There remains, therefore, a need in the field for a process for defining the width of polysilicon gates to critical dimensions that is controllable and extendible to well below 0.25 microns width (e.g. to width of 0.10 microns and below). The process should also be inexpensive and compatible with standard semiconductor device fabrication technologies.

SUMMARY OF THE INVENTION

The present invention provides a process for controllably defining the width of silicon gates (e.g. polysilicon and amorphous silicon gates) to critical dimensions that is inexpensive and compatible with standard semiconductor device fabrication technologies. Processes according to the present invention include steps of first providing a semiconductor substrate (e.g. a silicon wafer) with a gate oxide layer on its surface, followed by depositing a silicon (e.g. a polysilicon or amorphous silicon) gate layer on the gate oxide layer. A first oxide layer, such as a phosphosilicate glass (PSG) layer, tetraethylorthosilicate-based (TEOS-based) oxide layer, or a silane-based oxide layer, is then formed on the silicon gate layer. Next, the first oxide layer is patterned to form a patterned first oxide layer, exposing portions of the silicon gate layer. A second oxide layer is then formed on the patterned first oxide layer and the exposed portions of the silicon gate layer. Next, a first silicon (e.g. a polysilicon or amorphous silicon) layer is formed on the second oxide layer. The first silicon layer is subsequently patterned, exposing first portions of the second oxide layer, to form a patterned first silicon layer with sidewalls.

Next, a conformal spacer precursor layer, such as a conformal silicon nitride ($Si_3N_4$) layer or a conformal phosphosilicate glass (PSG) layer, is formed over the patterned first silicon layer and the exposed first portions of the second oxide layer. The conformal spacer precursor layer is then etched, stopping on and exposing second portions of the second oxide layer, to form spacers on the sidewalls of the patterned first silicon layer. The patterned first silicon layer is then removed, thereby exposing third portions of the second oxide layer. The exposed second and third portions of the second oxide layer are subsequently removed. The silicon gate layer is then etched, using at least one of the spacers as an etch hard mask, to define silicon gates of critical dimensions (e.g. silicon gate widths of 0.10 micron and less) in the silicon gate layer, while using the patterned first oxide layer as an etch hard mask to define non-critical dimensions in the silicon gate layer, thereby forming a patterned silicon gate layer.

Since processes in accordance with the present invention rely on spacers to define silicon gates of critical dimensions in a silicon gate layer, the processes are (i) more controllable and inexpensive than conventional processes which instead rely on photoresist mask layers, and (ii) able to define smaller dimensions (e.g. dimensions of 0.10 micron and less) than conventional lithographic techniques.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

In order to provide a clear and consistent understanding of the present invention and claims, the following definitions are hereby provided:

The term "critical dimension" refers to the minimum dimension (e.g. a silicon gate width of 0.25 microns) defined in a portion of a specified layer (e.g. a silicon gate layer) by a given process technology (e.g. "0.25 micron technology"). It also refers to a dimension that must be accurately and precisely defined. Critical dimensions are characterized as being the most difficult dimensions to controllably reproduce. Conversely, the term "non-critical" refers to those dimensions defined in the remainder of the specified layer that are significantly larger than the critical dimension for that layer. It also refers to a dimension that need not be precisely or accurately defined. Non-critical dimensions are characterized as being easy and inexpensive to reproduce in a controllable manner.

The term "critical," when used in reference to a layer (or portions of a layer), such as a "critical patterned photoresist layer," means that those layers (or portions thereof) contain minimum dimensions and must be accurately and precisely defined. Conversely, the term "non-critical," when used in reference to a layer (or portions of a layer), means that those layers (or portions thereof) do not contain minimum dimensions and need not be accurately and precisely defined.

The term "oxide layer" refers to single-layered silicon dioxide ($SiO_2$), as well as to multi-layered silicon dioxide (i.e. oxide "stacks"), both regardless of the presence of dopants or other additives. The term, therefore, includes: (i) silicon dioxide layers formed by the decomposition of tetraethyl-orthosilicate (TEOS, Si[OC$_2$H$_5$]$_4$); (ii) silicon dioxide layers resulting from the reaction of silane (SiH$_4$) or dichlorosilane (SiCl$_2$H$_2$); (iii) phosphosilicate glass (PSG) layers; and (iv) other SiO$_2$ based layers known in the field.

The term "conformal," when used in reference to a layer, means that the layer is formed on a substrate in such a manner that the thickness of the layer is essentially identical over any substrate surface topography. Therefore, when a conformal layer is formed over a patterned layer, the thickness of the conformal layer is identical on both the vertical and horizontal surfaces of the underlying patterned layer. See S. Wolf and R. N. Tauber, *Silicon Processing for the VLSI Era, Volume 1—Process Technology,* 185 (Lattice Press 1986), which is hereby incorporated by reference, for a further discussion of the term "conformal".

The terms "anisotropic" and "anisotropically" refer to an etch and etching technique wherein the etch proceeds primarily in one direction, typically in a vertical direction. See S. Wolf and R. N. Tauber, *Silicon Processing for the VLSI Era, Volume 1—Process Technology,* 522 (Lattice Press 1986), which is hereby incorporated by reference, for a further discussion of the term "anisotropic".

Figure 1:
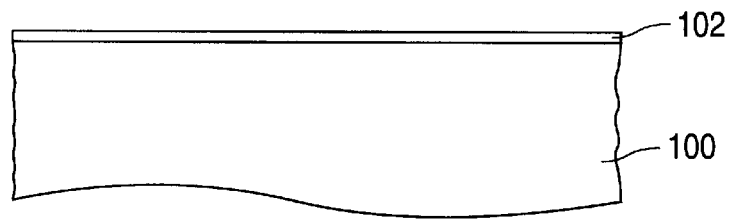
FIGS. 1–16 are cross-sectional views illustrating stages in a process in accordance with the present invention.
Figure 2:
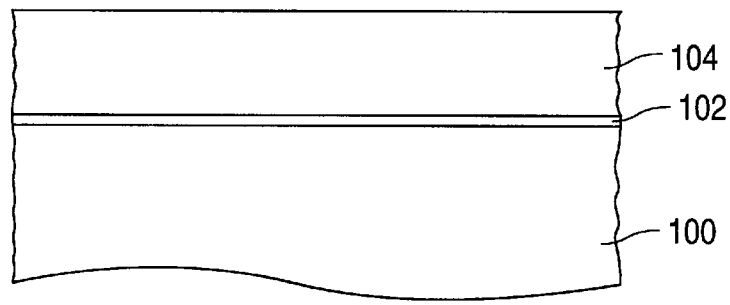

FIGS. 1–16 illustrate stages in a process in accordance with the present invention. First, a semiconductor substrate 100 (e.g. a silicon wafer) with a gate oxide layer 102 on its surface is provided, as illustrated in FIG. 1. Gate oxide layer 102 is typically a thermally grown SiO$_2$ layer of less than 100 angstroms in thickness. A silicon (e.g. polysilicon or amorphous silicon) gate layer 104 is then deposited on the gate oxide layer 102 using standard techniques well known in the field, such as Low Pressure Chemical Vapor Deposition (LPCVD). The silicon gate layer 104 has a typical thickness in the range of 1000 angstroms to 2000 angstroms. The resulting structure is shown in FIG. 2.

Figure 3:
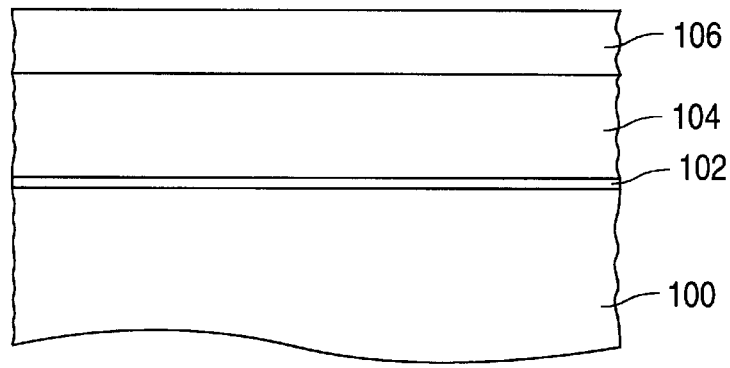

Next, a first oxide layer 106 is formed on the gate oxide layer 104, as illustrated in FIG. 3, by conventional means that are known to those of skill in the field, such as LPCVD or plasma-enhanced CVD (PECVD). The first oxide layer 106 has a typical thickness in the range of 500 angstroms to 1500 angstroms. Although TEOS-based oxides, silane-based oxides, PSG and other silicon dioxides (SiO$_2$) known in the field can be employed as the first oxide layer 106, PSG is preferred due to its high etch selectivity versus both polysilicon and undoped thermally grown SiO$_2$.

Figure 4:
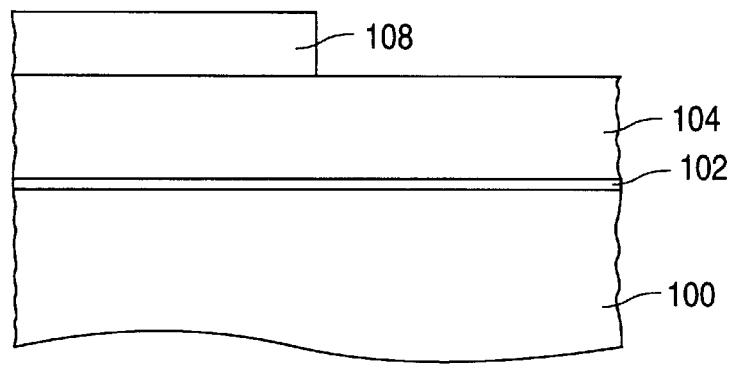
Figure 5:
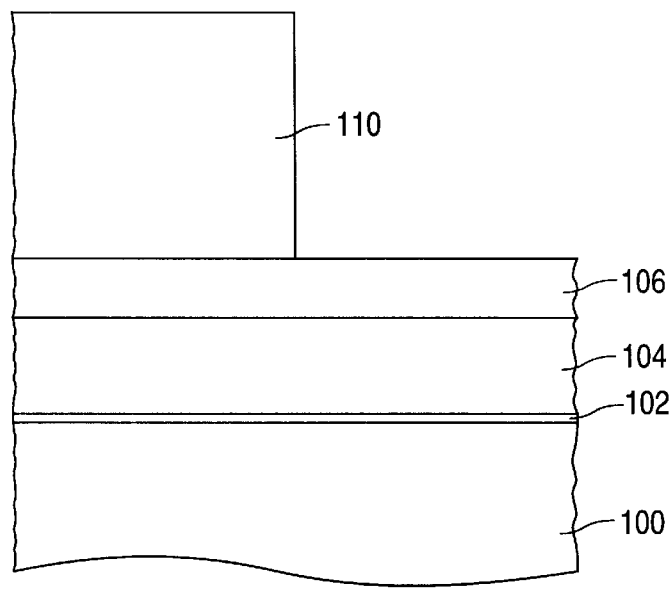
Figure 6:
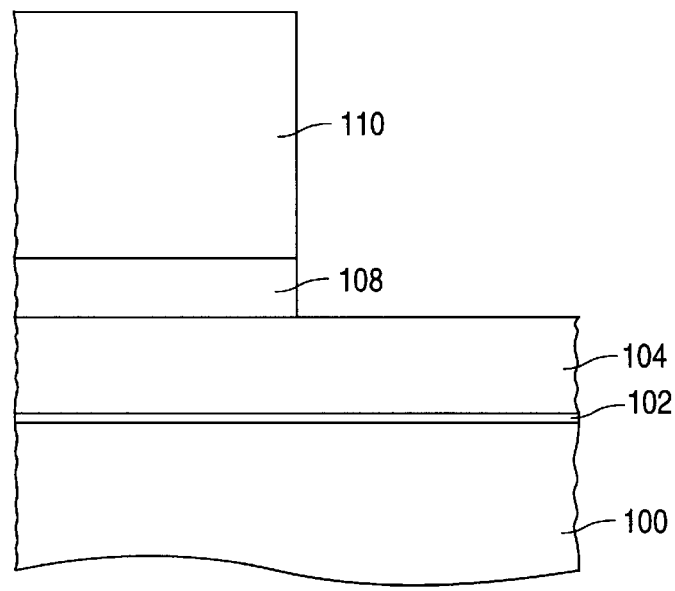

Next, the first oxide layer 106 is patterned to form a patterned first oxide layer 108, exposing portions of the silicon gate layer 104. The resulting structure is illustrated in FIG. 4. This patterning step exposes those portions of the silicon gate layer 104 that will be later patterned to critical dimensions, while forming the patterned first oxide layer 108 that will be later used to define non-critical dimensions of a patterned silicon gate layer (discussed below). The patterning of the first oxide layer 106 can be accomplished, for example, by etching the first oxide layer 106, using a first non-critical patterned photoresist mask layer 110 formed thereon as an etch mask (see FIGS. 5 and 6). Conventional etching techniques and equipment well known in the field can be employed. While the first non-critical patterned photoresist mask layer 110 has a typical thickness in the range of 2000 angstroms to 10,000 angstroms (i.e. 0.2 to 1.0 micron), it need only be thick enough to act as an etch barrier during this patterning step of the first oxide layer 106. After removal of the first non-critical patterned photoresist mask layer 110, for example, by conventional photoresist stripping techniques, the resulting structure is equivalent to that of FIG. 4.

Since the first non-critical patterned photoresist mask layer 110 defines (i.e. determines the boundaries of) the patterned first oxide layer 108, which will be later used to define non-critical dimensions of a patterned silicon gate layer 128B (discussed below), the first non-critical patterned photoresist mask layer 110 can, therefore, be thought of as defining the non-critical dimensions of the patterned silicon gate layer 128B. Due to its non-critical nature, the first non-critical patterned photoresist mask layer 110 need not to be precisely aligned with features on the semiconductor substrate and, therefore, can be inexpensively formed.

Figure 7:
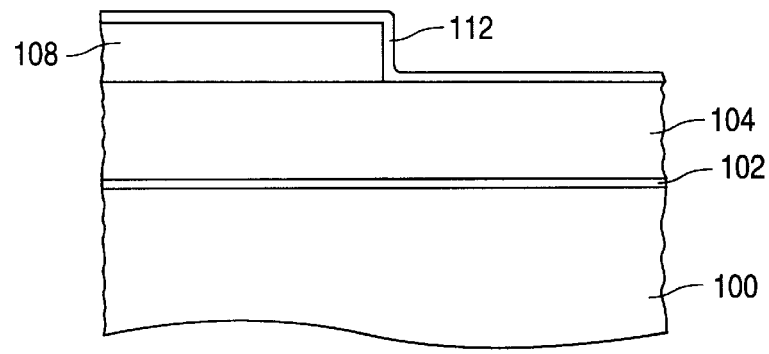

Next, a second oxide layer 112 is deposited on the patterned first oxide layer 108 and the exposed portions of the silicon gate layer 104, as illustrated in FIG. 7. Since second oxide layer 112 will be used as an etch stop layer in a subsequent patterning step of a first polysilicon layer 114 (discussed below), the thickness of the second oxide layer 112 is selected such that it is thick enough to act as such an etch stop layer. Moreover, since the underlying patterned first oxide layer 108 will be later used to define non-critical dimensions of a patterned silicon gate layer 128B (discussed below), the thickness of the second oxide layer 112 is selected such that it is thin enough that the resolution of the non-critical dimensions of patterned silicon gate layer 128B will not be significantly degraded. A typical thickness for second oxide layer 112 is, therefore, in the range of 50 angstroms to 150 angstroms. Second oxide layer 112 can be deposited by either conventional LPCVD or PECVD techniques, however, LPCVD is preferred since LPCVD techniques are generally more controllable in depositing layers with a thickness in the range of 50 angstroms to 150 angstroms. Although TEOS-based oxides, silane-based oxides, PSG and other silicon dioxides (SiO$_2$) known in the field can be employed as the second oxide layer 112, PSG is preferred due to its high etch selectivity versus both polysilicon and undoped thermally grown SiO$_2$.

Figure 8:
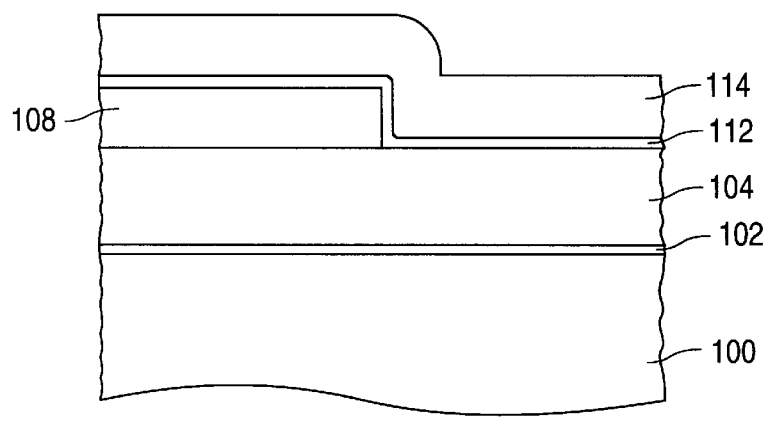

Next, a first silicon (e.g. polysilicon or amorphous silicon) layer 114 is deposited on the second oxide layer 112. The resulting structure is shown in FIG. 8. The thickness of the first silicon layer 114 should be of the order of the width of spacers 122 and 124 (discussed below) that will be later used to define the critical dimensions of silicon gates. This is because the first silicon layer 114 is the precursor to a patterned first silicon layer 116 (discussed below), along whose sidewalls the spacers 122 and 124 will be formed. And, since a conformal spacer precursor layer 120 (discussed below) conforms to the surface topography of an underlying substrate (e.g. patterned first silicon layer 116), the thickness thereof will be essentially identical on both the vertical surface (i.e. "sidewall") and the horizontal surface of the patterned first silicon layer 116. The width of the spacers 122 and 124 is, therefore, controlled by the thickness of the patterned first silicon layer 116, as well as by the thickness of the conformal spacer precursor layer 120. Thus, if the desired spacer width is 0.10 microns (i.e. 1,000 angstroms), the thickness of the first silicon layer 114 is also approximately 0.10 microns. The first silicon layer 114 can be deposited by conventional techniques, such as LPCVD. While non-silicon layers can be substituted for the first silicon layer 114, polysilicon is preferred because it has a relatively high etch selectivity over oxide layers and it is well characterized and relatively inexpensive.

Figure 9:
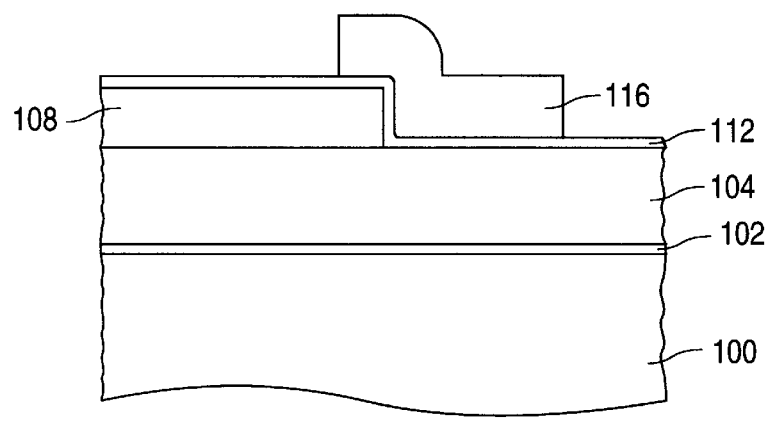
Figure 10:
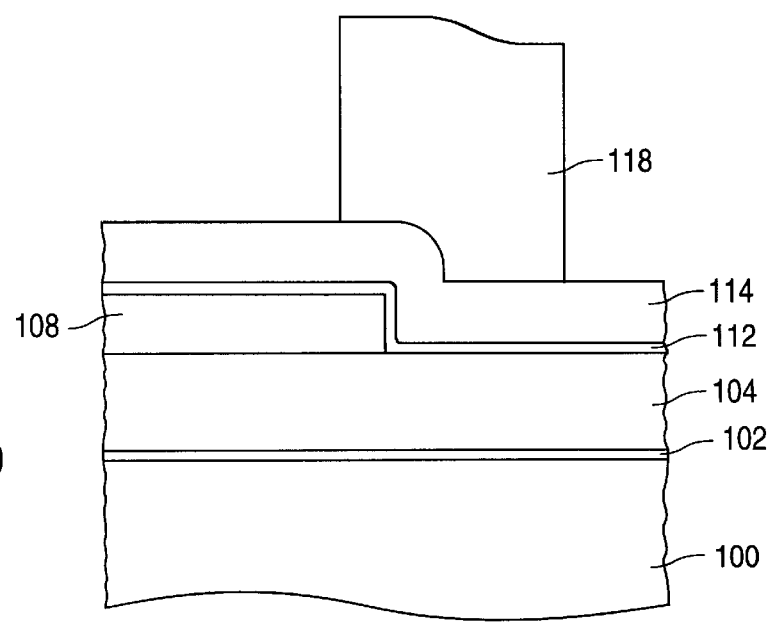
Figure 11:
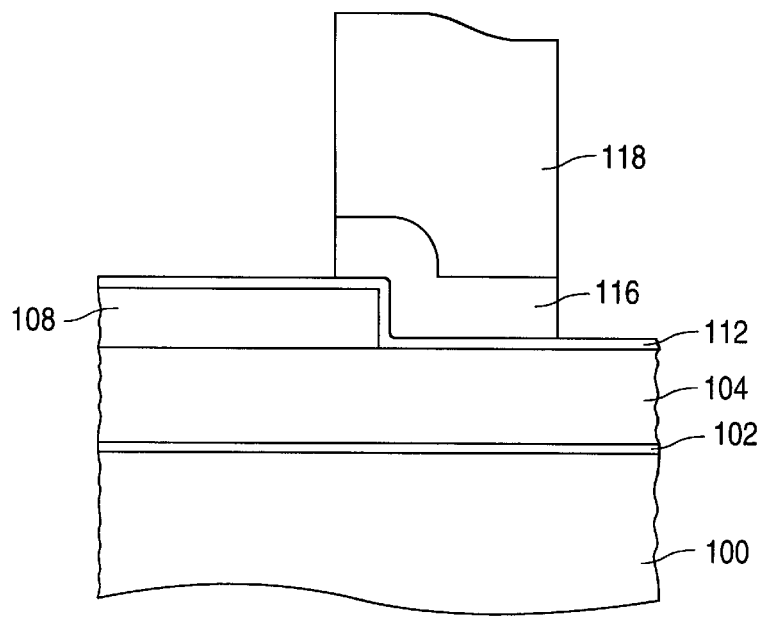

Next, the first silicon layer 114 is patterned to form a patterned first silicon layer 116, stopping on and exposing first portions of the second oxide layer 112, as illustrated in FIG. 9. The patterned first silicon layer 116 defines the locations of spacers 122 and 124 (discussed below) since they will be formed on the sidewalls of the patterned first silicon layer 116. The patterning of the first silicon layer 114 can be accomplished, for example, by etching the first silicon layer 114, using a second non-critical patterned photoresist mask layer 118 formed thereon as an etch mask (see FIG. 10). The resultant structure is shown in FIG. 11. Conventional etching techniques and equipment well known in the field can be employed. While the second non-critical patterned photoresist mask layer 118 has a typical thickness is in the range of 2000 angstroms to 10,000 angstroms (i.e. 0.2 to 1 micron), it need only be thick enough to act as an etch barrier during this patterning step of first silicon layer 114. After removal of the second non-critical patterned photoresist mask layer 118, for example, by conventional photoresist stripping techniques, the resulting structure is equivalent to that of FIG. 9. Since the resultant patterned first silicon layer 116 defines the locations of spacers 122 and 124, the design/layout of the second non-critical patterned photoresist mask layer 118 is crucial and can be accomplished using, for example, manual cell layout methodologies known in the field.

Figure 12:
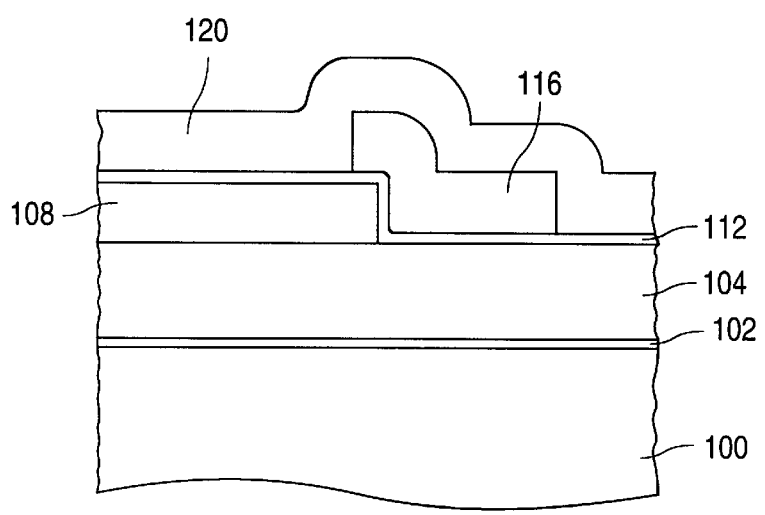

Next, a conformal spacer precursor layer 120 is formed covering the patterned first silicon layer 116 and the exposed first portions of the second oxide layer 112. The resulting structure is depicted in FIG. 12. The thickness of the conformal spacer precursor layer 120 is of the order of the critical dimension to be defined. For example, if a portion of the silicon gate layer 104 is to be patterned to form a silicon gate with a critical dimension of 0.10 micron, then the conformal spacer precursor layer 120 should also be approximately 0.10 microns (i.e. 1000 angstroms) thick. The thickness of the conformal spacer precursor layer 120, therefore, scales with the critical dimension to be defined. For reasons explained in conjunction with the next step, conformal spacer precursor layer 120 is either a silicon nitride ($Si_3N_4$) layer or an oxide layer (e.g. a PSG layer).

Figure 13:
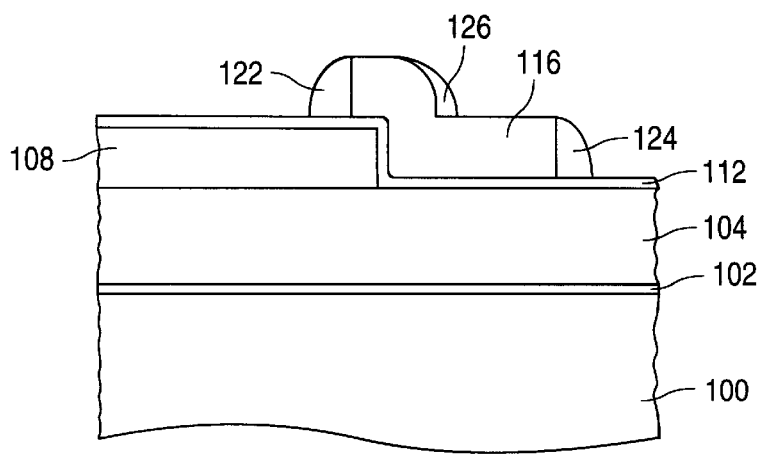

Next, the conformal spacer precursor layer 120 is etched, for example, using conventional anisotropic etching techniques, stopping on and exposing second portions of the second oxide layer 112, to form spacers 122 and 124 on the sidewalls of the patterned first silicon layer 116. Residual conformal spacer precursor layer feature 126 is also formed as a result of this etching step. The resultant structure is illustrated in FIG. 13. The preference for either silicon nitride or an oxide layer as the conformal spacer precursor layer 120 is based on their relatively high etch selectivity over polysilicon during conventional etching techniques. When both the conformal spacer precursor layer 120 and the second oxide layer 112 are formed of PSG, a conventional timed etch can be used to prevent etching entirely through the second oxide layer 112.

Figure 14:
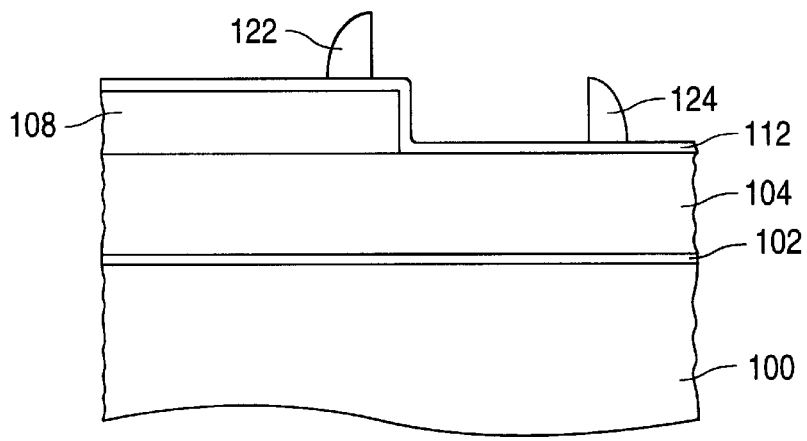

The patterned first silicon layer 116 is then removed, along with residual conformal spacer precursor layer feature 126, using, for example, conventional etching techniques, leaving spacers 122 and 124 and exposing third portions of the second oxide layer 112. The resulting structure is illustrated in FIG. 14.

Figure 15:
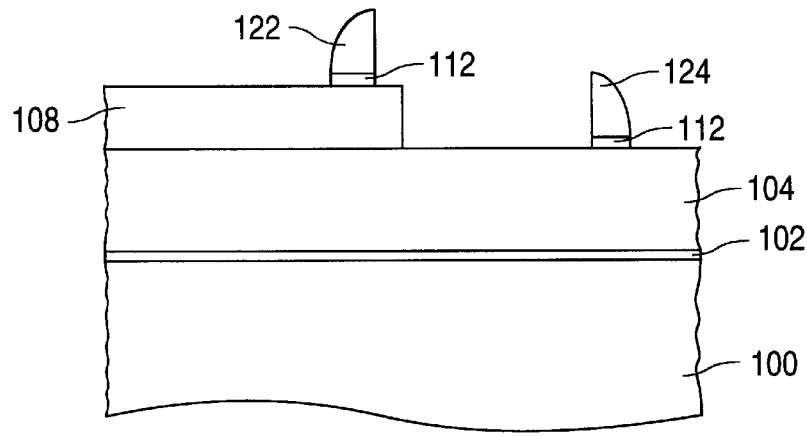

The exposed second and third portions of the second oxide layer 112 are then removed by, for example, an anisotropic oxide etch using the spacers 122 and 124 as etch hard masks, to expose portions of the patterned first oxide layer 108, as well as portions of the silicon gate layer 104. The resulting structure is shown in FIG. 15. If the spacers 122 and 124 are formed of PSG or other oxide material, they would, of course, be partially etched during this removal of the exposed second and third portions of the second oxide layer 112. However, the partial etching of the spacers (i.e. decrease in spacer height) can be minimized by (i) selecting those from amongst the various oxide materials for the second oxide layer and spacers that provide a high etch selectivity of the second oxide layer over the spacers and (ii) keeping the second oxide layer thickness significantly less than the spacer height.

Figure 16:
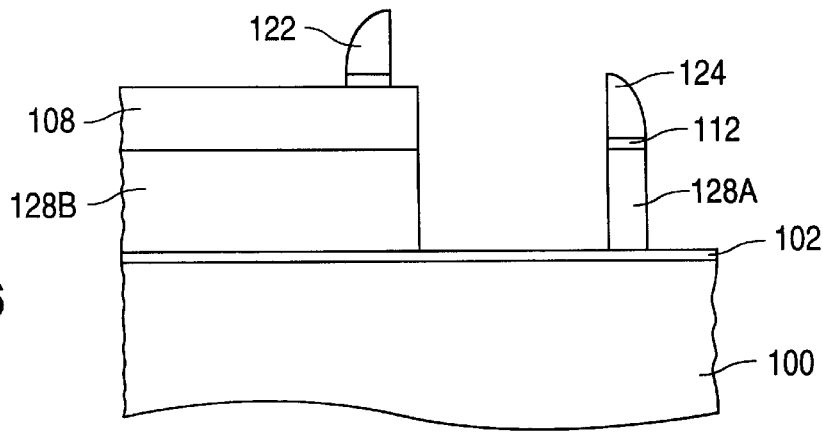

Next, the silicon gate layer 104 is patterned, using the spacer 124 and patterned first oxide layer 108 as etch hard masks, to form a first portion of a patterned silicon gate layer 128A that is defined to a critical dimension, and a second portion of a patterned silicon gate layer 128B that is defined to a non-critical dimension, respectively (see FIG. 16). In other words, the first portion of the patterned silicon gate layer 128A was defined to a critical dimension by the width of the overlying spacer 124, while the second portion of the patterned silicon gate layer 128B was defined to a non-critical dimension by the overlying patterned first oxide layer 108. This patterning step can be accomplished using conventional anisotropic silicon etch techniques that are well known in the field.

It should be noted that while spacer 122 is located above patterned first oxide layer 108 and, therefore, does not define a critical dimension in this embodiment of the process according to the present invention, other embodiments, where both spacers 122 and 124 are used as etch hard masks to define critical dimensions in a patterned silicon gate layer, are also envisioned.

When desired, to enhance planarity, spacers 122 and 124 and/or patterned first oxide layer 108 can be removed following the patterning of the silicon gate layer 104 using an anisotropic etch. Alternatively, the spacers 122 and 124 and patterned first oxide layer 108 can be left intact at the termination of the process. Conventional photolithography-based patterning techniques are capable of defining critical dimensions only to within ±0.02 microns and require the use of expensive critical patterned photoresist mask layers. It is estimated, on the other hand, that processes according to the present invention are capable of accurately defining critical dimensions as small as 0.05 microns with a precision of ±0.005 microns. Furthermore, processes in accordance with the present invention do not require the use of critical patterned photoresist mask layers.

It should be understood that various alternatives to the embodiments of the invention described herein may be employed in practicing the invention. For example, while specific dimensions (including layer thicknesses) and material layers have been set forth to illustrate the invention, they are not intended to limit the invention. It is intended that the following claims define the scope of the invention and that methods within the scope of these claims and their equivalents be covered thereby.

What is claimed is:

1. A method for defining the width of silicon gates to critical dimensions, the method comprising the steps of:

providing a semiconductor substrate with a gate oxide layer disposed thereon;

depositing a silicon gate layer on the gate oxide layer;

forming a first oxide layer on the silicon gate layer;

patterning the first oxide layer to form a patterned first oxide layer and to expose portions of the silicon gate layer;

forming a second oxide layer on the patterned first oxide layer and the exposed portions of the silicon gate layer;

depositing a first silicon layer on the second oxide layer;

patterning the first silicon layer to form a patterned first silicon layer and to expose first portions of the second oxide layer;

forming a conformal spacer precursor layer over the patterned first silicon layer and the exposed first portions of the second oxide layer;

etching the conformal spacer precursor layer, stopping on and exposing second portions of the second oxide layer, to form spacers on sidewalls of the patterned first silicon layer;

removing the patterned first silicon layer, thereby exposing third portions of the second oxide layer;

removing the exposed second and third portions of the second oxide layer; and etching the silicon gate layer to form a patterned silicon gate layer, while using at least one of the spacers as an etch hard mask, to define a silicon gate to a critical dimension in the patterned silicon gate layer.

2. The method of claim 1 wherein the step of depositing a silicon gate layer includes depositing a polysilicon gate layer and wherein the step of depositing a first silicon layer includes depositing a first polysilicon layer.

3. The method of claim 1 wherein the step of etching the silicon gate layer includes using the patterned first oxide layer as an etch hard mask to define a non-critical dimension in the patterned silicon gate layer.

4. The method of claim 1, wherein the step of forming a conformal spacer precursor layer includes forming a conformal spacer precursor layer selected from the group consisting of conformal silicon nitride spacer precursor layers and conformal phosphosilicate glass (PSG) spacer precursor layers.

5. The method of claim 1, wherein the step of forming a conformal spacer precursor layer includes forming a conformal spacer precursor layer with a thickness less than 1000 angstroms.

6. The method of claim 1 wherein the steps of forming a first oxide layer and forming a second oxide layer include forming oxide layers selected from the group consisting of phosphosilicate glass (PSG) layers, tetraethylorthosilicate-based (TEOS-based) oxide layers, and silane-based oxide layers.

7. The method of claim 1 wherein the step of patterning the first oxide layer includes using a first non-critical patterned photoresist mask layer and an anisotropic etching technique.

8. The method of claim 7 wherein the step of patterning the first silicon layer includes using a second non-critical patterned photoresist mask layer and an anisotropic etching technique.

9. The method of claim 1 wherein the step of etching the conformal spacer precursor layer includes forming spacers with a maximum width no greater than 0.25 micron.

10. The method of claim 1 wherein the step of etching the silicon gate layer uses an anisotropically etching technique.

11. A method for defining the width of polysilicon gates to critical dimensions, the method comprising the steps of:

providing a semiconductor substrate with a gate oxide layer disposed thereon;

depositing a polysilicon gate layer on the gate oxide layer;

forming a first phosphosilicate glass (PSG 1) layer on the polysilicon gate layer;

patterning the PSG 1 layer to form a patterned PSG 1 layer and to expose portions of the polysilicon gate layer;

forming a second phosphosilicate glass (PSG 2) layer on the patterned PSG 1 layer and the exposed portions of the polysilicon gate layer;

depositing a first polysilicon layer on the PSG 2 layer;

patterning the first polysilicon layer to form a patterned first polysilicon layer and expose first portions of the PSG 2 layer;

forming a conformal spacer precursor layer over the patterned first polysilicon layer and exposed first portions of the PSG 2 layer, wherein the conformal spacer precursor layer is selected from the group consisting of conformal silicon nitride spacer precursor layers and conformal phosphosilicate glass (PSG) spacer precursor layers;

anisotropically etching the conformal spacer precursor layer, stopping on and exposing second portions of the PSG 2 layer, to form spacers on sidewalls of the patterned first polysilicon layer;

removing the patterned first polysilicon layer, thereby exposing third portions of the PSG 2 layer;

removing the exposed second and third portions of the PSG 2 layer; and anisotropically etching the polysilicon gate layer to form a patterned polysilicon gate layer, while using at least one of the spacers as an etch hard mask, to define a polysilicon gate to a critical dimension in the patterned polysilicon gate layer.

* * * * *